US010616989B2

(12) United States Patent
Aoi et al.

(10) Patent No.: US 10,616,989 B2
(45) Date of Patent: Apr. 7, 2020

(54) PLASMA GENERATION APPARATUS INCLUDING MEASUREMENT DEVICE AND PLASMA THRUSTER

(71) Applicant: MITSUBISHI HEAVY INDUSTRIES, LTD., Tokyo (JP)

(72) Inventors: Tatsufumi Aoi, Tokyo (JP); Kengo Yamaguchi, Tokyo (JP); Ryuichi Matsuda, Tokyo (JP); Akio Ikeda, Tokyo (JP); Hirofumi Shimizu, Tokyo (JP); Takuya Yamazaki, Tokyo (JP); Tatsuya Kimura, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 707 days.

(21) Appl. No.: 15/307,482

(22) PCT Filed: Apr. 10, 2015

(86) PCT No.: PCT/JP2015/061265
§ 371 (c)(1),
(2) Date: Oct. 28, 2016

(87) PCT Pub. No.: WO2015/166787
PCT Pub. Date: Nov. 5, 2015

(65) Prior Publication Data
US 2017/0064806 A1    Mar. 2, 2017

(30) Foreign Application Priority Data

May 2, 2014    (JP) .................................. 2014-095399

(51) Int. Cl.
*H05H 1/46*    (2006.01)
*H05H 1/54*    (2006.01)
(Continued)

(52) U.S. Cl.
CPC .............. *H05H 1/46* (2013.01); *F03H 1/0037* (2013.01); *F03H 1/0081* (2013.01);
(Continued)

(58) Field of Classification Search
CPC ........ F03H 1/00; F03H 1/0006; F03H 1/0012; F03H 1/0018; F03H 1/0037;
(Continued)

(56) References Cited

U.S. PATENT DOCUMENTS

| 6,447,850 B1 | 9/2002 | Ebe et al. |
| 2002/0192394 A1 | 12/2002 | Ebe et al. |

(Continued)

FOREIGN PATENT DOCUMENTS

| JP | 2000-100598 | 4/2000 |
| JP | 2000-100599 | 4/2000 |

(Continued)

OTHER PUBLICATIONS

Yamamoto "Measurements of electron density and temperature in a miniature microwave discharge ion thruster using laser Thomson scattering technique" (Year: 2010).*

(Continued)

*Primary Examiner* — Gerald L Sung
*Assistant Examiner* — William L Breazeal
(74) *Attorney, Agent, or Firm* — Wenderoth, Lind & Ponack, L.L.P.

(57) ABSTRACT

A plasma generation apparatus, and a plasma thruster configured to use the plasma generation apparatus are disclosed. The plasma generation apparatus includes a discharge vessel, a light-emitting monitor, a probe measuring instrument, a control device, and an optical axis driving unit. The discharge vessel is configured to ionize gas which is introduced to an inside thereof so as to generate plasma. The light-emitting monitor is configured to measure electron (Continued)

density of the plasma by emission spectra of the plasma. The probe measuring instrument is configured to measure the electron density of the plasma by a probe in the discharge vessel.

9 Claims, 7 Drawing Sheets

(51) Int. Cl.
*H05H 1/00* (2006.01)
*F03H 1/00* (2006.01)
*G01N 21/71* (2006.01)
*G01R 29/24* (2006.01)

(52) U.S. Cl.
CPC ........... *G01N 21/718* (2013.01); *G01R 29/24* (2013.01); *H05H 1/0037* (2013.01); *H05H 1/54* (2013.01); *H05H 2001/4645* (2013.01)

(58) Field of Classification Search
CPC .... F03H 1/0043; F03H 1/0056; F03H 1/0062; F03H 1/0068; F03H 1/0075; F03H 1/0081; F03H 1/0087; F03H 1/0093; B64G 1/405; H05H 1/0037; H05H 1/0075; H05H 1/0062; H05H 1/46; H01J 37/32935; H01J 37/32174
See application file for complete search history.

(56) References Cited

U.S. PATENT DOCUMENTS

| | | |
|---|---|---|
| 2005/0009347 A1 | 1/2005 | Matsumoto et al. |
| 2007/0089835 A1 | 4/2007 | Koshimizu et al. |
| 2007/0193514 A1 | 8/2007 | Matsumoto et al. |
| 2007/0284044 A1 | 12/2007 | Matsumoto et al. |
| 2013/0093350 A1* | 4/2013 | Hruby ................. H05H 1/00 315/267 |

FOREIGN PATENT DOCUMENTS

| | | |
|---|---|---|
| JP | 2000-195810 | 7/2000 |
| JP | 2000-269191 | 9/2000 |
| JP | 2001-196199 | 7/2001 |
| JP | 2005-228727 | 8/2005 |

OTHER PUBLICATIONS

Bibinov "Determination of the electron energy distribution function via optical emission spectroscopy and a Langmuir probe in an ICP" (Year: 2008).*
Spektor "Non-Invasive Plasma Diagnostic Inside a Hall Thruster Discharge" (Year: 2007).*
Scott "Emission Spectroscopy for the Study of Electric Propulsion Plasmas" (Year: 2009).*
Written Opinion of the International Searching Authority dated May 26, 2015 in corresponding International Application No. PCT/JP2015/061265.
International Search Report dated May 26, 2015 in corresponding International Application No. PCT/JP2015/061265.

* cited by examiner

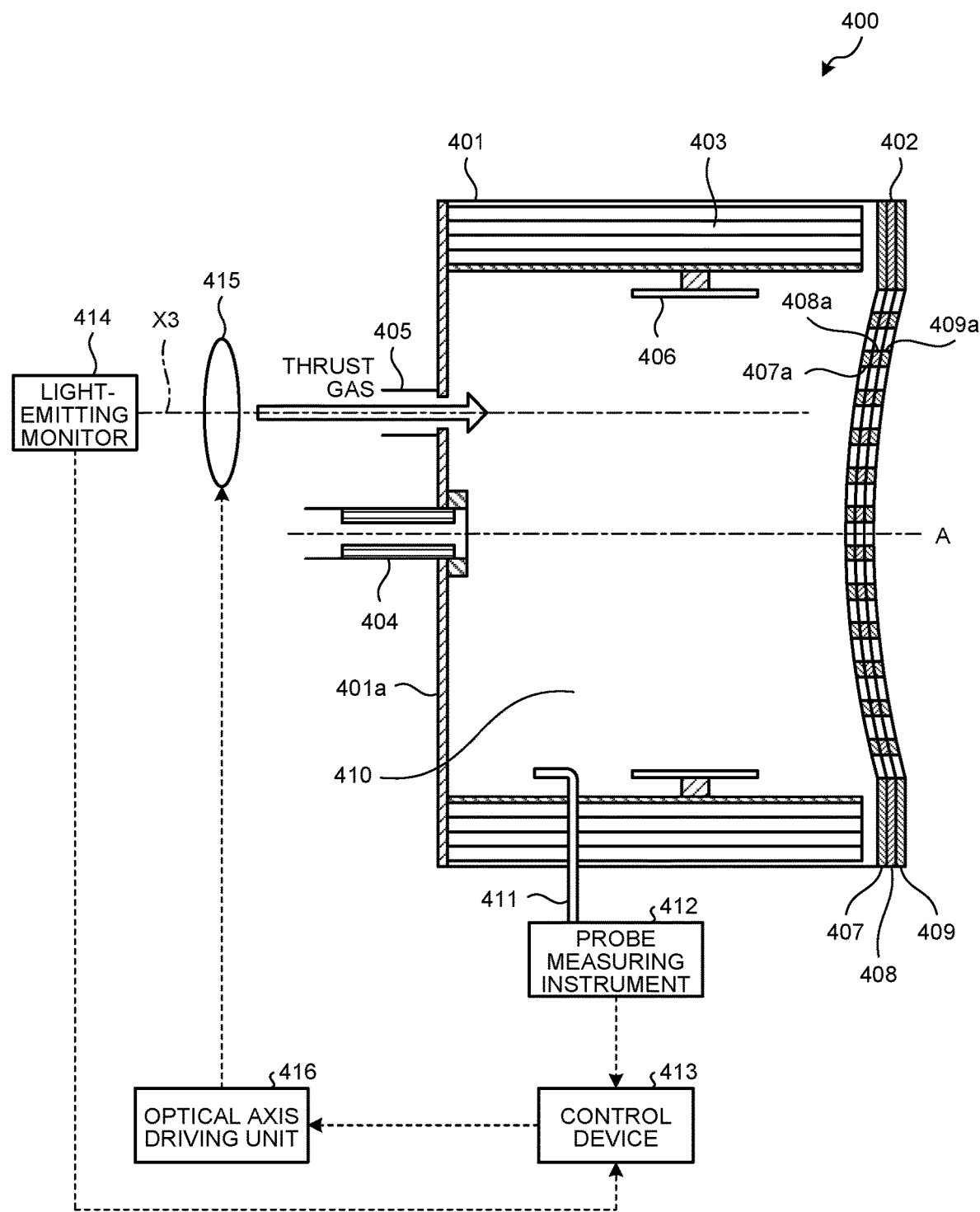

PLASMA GENERATION APPARATUS INCLUDING MEASUREMENT DEVICE AND PLASMA THRUSTER

FIELD

The present invention relates to a plasma generation apparatus including a measurement device and relates to a plasma thruster. Specifically, the present invention relates to a plasma generation apparatus including an emission spectra measurement device and a probe measurement device and relates to a plasma thruster.

BACKGROUND

In recent years, attention has been focused on a plasma thruster as a thruster for space rockets. In this plasma thruster, gas such as xenon working as a propellant (thrust gas) is ionized and made into charged particles. Thereafter, the charged particles are affected by electromagnetic force and expansive force so that the charged particles are thrusted with high efficiency compared to a thruster for space rockets in the related arts. The following apparatus has been suggested as an example of a plasma generation apparatus relating to such a plasma thruster. That is, an apparatus in which light from plasma generated in a discharge vessel is detected so as to measure temporal changes in ion density of discharge plasma (For example, Japanese Patent Publication No. 2000-269191).

Technical Problem

In a plasma generation apparatus in the related arts, temporal changes in conditions of plasma can be measured but it is difficult to quantitatively measure and control the conditions of the plasma since generation conditions is controlled by light from the plasma. Accordingly, there is a demand for a plasma generation apparatus capable of controlling the conditions of the plasma more properly and for a plasma thruster using the plasma generation apparatus.

SUMMARY

The present invention has been made in light of such situations. An object of the present invention is to provide a plasma generation apparatus including a measurement device and capable of controlling the conditions of the plasma properly and stably and to provide a plasma thruster using the plasma generation apparatus.

Solution to Problem

A plasma generation apparatus including a measurement device of a present invention includes a plasma generation unit ionizing gas introduced to an inside thereof so as to generate plasma, an emission spectra measurement device measuring electron density of the plasma by emission spectra of the plasma, a probe measurement device measuring the electron density of the plasma by a probe disposed in the plasma generation unit, a control device controlling at least one of an amount of electric power to be supplied to the plasma generation unit, magnetic field distribution, and an amount of supply gas based on measurement results of the electron density of the plasma measured by the emission spectra measurement device and probe measurement device, and an optical axis driving unit changing an optical axis of light from the plasma entering the emission spectra measurement device.

According to the above-mentioned plasma generation apparatus including the measurement device, an optical axis of light from plasma entering to an emission spectra measurement device can be changed by an optical axis driving unit. Therefore, it is possible to measure distribution of electron density of the plasma generated inside a plasma generation unit throughout a whole area of the plasma generation unit. Moreover, a relative value of the electron density of the plasma measured by the emission spectra measurement device can be corrected by an absolute value of the electron density of the plasma measured by a probe measurement device. Therefore, it is possible to measure distribution of the absolute value of the electron density of the plasma generated in the plasma generation unit throughout the whole area of the plasma generation unit. Accordingly, a control device can control such as an amount of electric power to be supplied to the plasma generation unit, magnetic field distribution, and an amount of supply gas based on the distribution of the measured absolute value of the electron density of the plasma. Therefore, it is possible to achieve the plasma generation apparatus including the measurement device and capable of controlling conditions of plasma properly and stably.

In the plasma generation apparatus including the measurement device of the present invention, it is preferable that the emission spectra measurement device classifies a first emission spectrum based on a neutral particle in the plasma and a second emission spectrum based on an ion in the plasma and measures a ratio of spectral intensity between the first emission spectrum and second emission spectrum, and the control device controls at least one of the amount of the electric power to be supplied to the plasma generation unit, the magnetic field distribution, and the amount of the supply gas based on the measured ratio of the spectral intensity.

In the plasma generation apparatus including the measurement device of the present invention, it is preferable that the probe is a high frequency probe. According to such a configuration, even though there is a magnetic field and the electron density of the plasma is high, the electron density of the plasma inside the plasma generation unit can be measured quantitatively and efficiently.

In the plasma generation apparatus including the measurement device of the present invention, it is preferable that the probe is provided to an area where the electron density of the plasma is equal to $1E18 \text{ m}^{-3}$ or more and $1E19 \text{ m}^{-3}$ or less. According to such a configuration, a probe can be disposed within a range where the electron density of the plasma is moderate. Therefore, without being affected by the conditions of the plasma in an area where the electron density of the plasma is high, it is possible to stably control the conditions of the plasma.

A plasma thruster of the present invention includes the plasma generation apparatus including the above-described measurement device. According to a plasma thruster including the plasma generation apparatus including the measurement device, the optical axis of the light from the plasma entering into the emission spectra measurement device can be changed by the optical axis driving unit. Therefore, it is possible to measure the distribution of the electron density of the plasma generated inside the plasma generation unit throughout the whole area of the plasma generation unit. Moreover, a relative value of the electron density of the plasma measured by the emission spectra measurement device can be corrected by an absolute value of the electron density of the plasma measured by a probe measurement device. Therefore, it is possible to measure distribution of the absolute value of the electron density of the plasma generated in the plasma generation unit throughout the whole area of the plasma generation unit. Accordingly, the control device can control such as the amount of the electric power to be supplied to the plasma generation unit based on the distribution of the measured absolute value of the electron density of the plasma. Therefore, it is possible to achieve the plasma thruster capable of controlling the conditions of the plasma properly and stably.

Advantageous Effects of Invention

According to the present invention, it is possible to achieve a plasma generation apparatus including a measurement device and capable of controlling conditions of plasma properly and stably and to achieve a plasma thruster using the plasma generation apparatus.

BRIEF DESCRIPTION OF DRAWINGS

FIG. 3 is a schematic cross-sectional view of an ion thruster using a plasma thruster according to the embodiment.

DESCRIPTION OF EMBODIMENTS

Hereinafter, an embodiment of the present invention will be described in detail with reference to the accompanying drawings. Note that the present invention should not be restricted to the following embodiment but can be appropriately modified.

Figure 1:
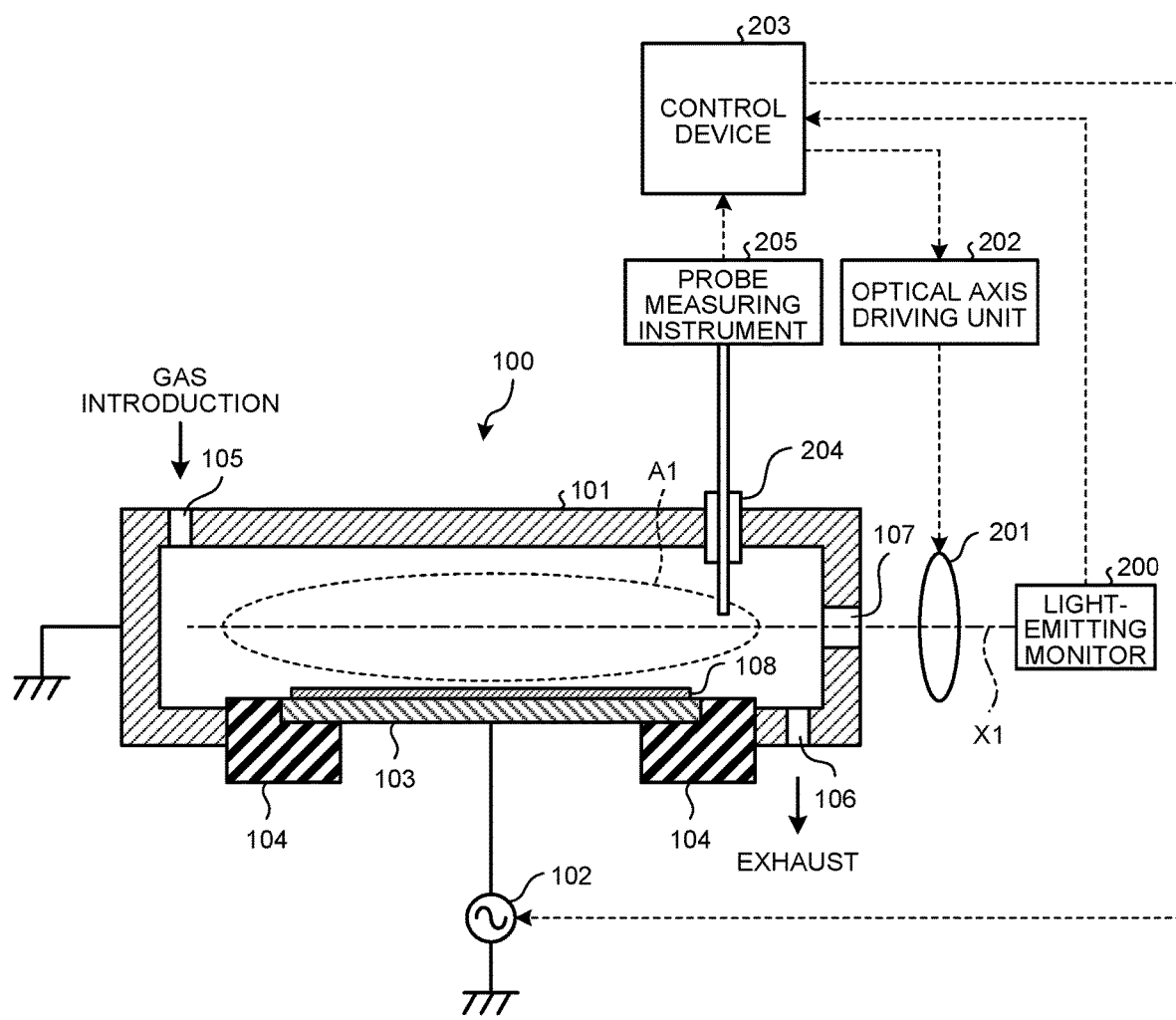
FIG. 1 is a schematic view illustrating a plasma generation apparatus including a measurement device according to an embodiment of the present invention.

FIG. 1 is a schematic view illustrating a plasma generation apparatus 1 including a measurement device according to the embodiment of the present invention (hereinafter simply referred to as "plasma generation apparatus 1"). As illustrated in FIG. 1, the plasma generation apparatus 1 according to the embodiment includes a discharge vessel (plasma generation unit) 100 with a plasma generation area A1 in which plasma is generated. This discharge vessel 100 includes an anode 101, a cathode 103, and insulation members 104. The anode 101 is connected to a ground potential. The cathode 103 is supplied with radio frequency (RF) electric power from a RF power source 102. The insulation members 104 are provided between the anode 101 and cathode 103 and insulate the anode 101 from the cathode 103. The anode 101 is provided with a gas introduction hole 105, an exhaust hole 106, and a light transmission window 107. The gas introduction hole 105 introduces process gas such as xenon, argon, and krypton, into the discharge vessel 100. The exhaust hole 106 exhausts gas inside the discharge vessel 100. The light transmission window 107 transmits light from the plasma generated in the discharge vessel 100 so as to emit the light to an outside of the discharge vessel 100.

In this plasma generation apparatus 1, the gas inside the discharge vessel 100 is discharged by an evacuation device (not illustrated) through the exhaust hole 106 to the outside of the discharge vessel 100 so as to form a vacuum inside the discharge vessel 100. Under this condition, the process gas is introduced from the gas introduction hole 105 and the process gas is ionized by the RF electric power supplied from the RF power source 102. Accordingly, the plasma is generated in the plasma generation area A1 inside the discharge vessel 100. Due to this plasma, for example, it is possible to carry out fine-processing on an object to be processed 108 such as silicon wafer disposed on the cathode 103.

In the outside of the discharge vessel 100, a light-emitting monitor (emission spectra measurement device) 200 is disposed. The light-emitting monitor 200 receives the light of the plasma inside the discharge vessel 100 through the light transmission window 107 and measures emission spectra. This light-emitting monitor 200 classifies a first emission spectrum based on neutral particles in the plasma and a second emission spectrum based on ions in the plasma. The light-emitting monitor 200 also measures a ratio of spectral intensity between the first emission spectrum and second emission spectrum. Between the light-emitting monitor 200 and light transmission window 107, a condensing lens 201 is disposed. The condensing lens 201 condenses the light of the plasma inside the discharge vessel 100 and allows the light to irradiate the light-emitting monitor 200. This condensing lens 201 is disposed such that an angle of the condensing lens 201 can be changed by an optical axis driving unit 202. By changing the angle of the condensing lens 201, the optical axis driving unit 202 changes an optical axis X1 of the light from the plasma entering into the light-emitting monitor 200. The light-emitting monitor 200 outputs the measured emission spectra of the plasma on a control device 203.

Furthermore, the anode 101 of the discharge vessel 100 is provided with a probe 204. An end of this probe 204 is disposed in the plasma generation area A1 inside the discharge vessel 100. The probe 204 is connected to a probe measuring instrument 205. The probe measuring instrument 205 measures, with the probe 204, electron density of the plasma generated inside the discharge vessel 100. The probe measuring instrument 205 outputs the measured electron density of the plasma to the control device 203. Examples of the probe 204 to be applied herein include various types of probes such as a plasma absorption probe (PAP), Langmuir probe, and antenna probe. A preferable example of the probe 204 is a high frequency probe from a point of view that the electron density of the plasma inside the plasma generation unit can be measured quantitatively and efficiently even though there is a magnetic field and the electron density of the plasma is high. Furthermore, the probe 204 is preferably set within a range in a periphery of the plasma generation area A1 where the electron density of the plasma is relatively small (for example, $1E18$ $m^{-3}$ or more and $1E19$ $m^{-3}$ or less). According to such a disposition, the probe 204 can be disposed within a range where the electron density of the plasma is moderate. Therefore, without being affected by conditions of the plasma in an area where the electron density of the plasma is higher, it is possible to stably control the conditions of the plasma.

The control device 203 can be achieved, for example, by using a general-purpose computer such as a central processing unit (CPU), read only memory (ROM), random access memory (RAM) or an exclusive-use computer and a program running on these computers. The control device 203 controls an amount of the electric power to be supplied from the RF power source 102 to the cathode 103 and an amount of gas to be supplied from the gas introduction hole 105 based on the electron density of the plasma measured by the probe measuring instrument 205 and the emission spectra of the plasma measured by the light-emitting monitor 200. Accordingly, the plasma generated in the plasma generation area A1 inside the discharge vessel 100 can be controlled to desired electron density. Furthermore, the control device 203 drives the condensing lens 201 through the optical axis driving unit 202 and controls the optical axis X1 of the light of the plasma entering into the light-emitting monitor 200. As a result, it is possible to measure the electron density of the plasma in a whole area of the plasma generation area A1 by the light-emitting monitor 200. Preferably, the control device 203 controls the amount of the electric power to be supplied to the anode cathode 103 based on the ratio of the spectral intensity measured by the light-emitting monitor 200. Accordingly, the conditions of the plasma can be controlled based on the ratio of the spectral intensity between the neutral particles and ions of the plasma. Therefore, it is possible to qualitatively control the electron density of the plasma with ease.

Figure 2A:
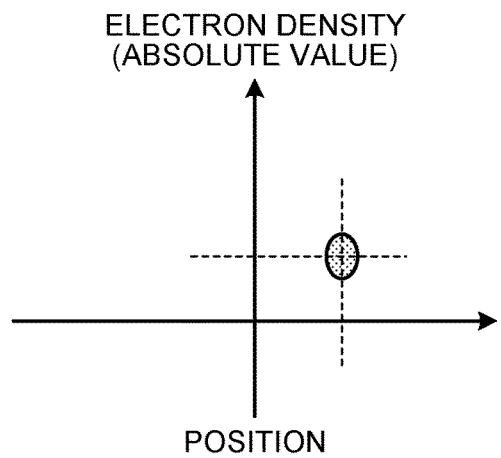
FIG. 2A is a view for explaining a measurement result of electron density of plasma measured by a probe measuring instrument.
Figure 2B:
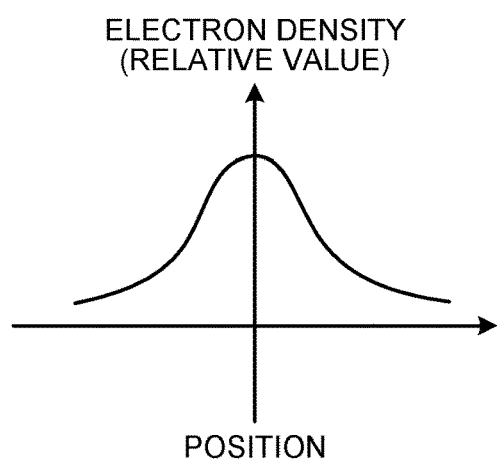
FIG. 2B is a view for explaining a measurement result of the electron density of the plasma measured by a light-emitting monitor.
Figure 2C:
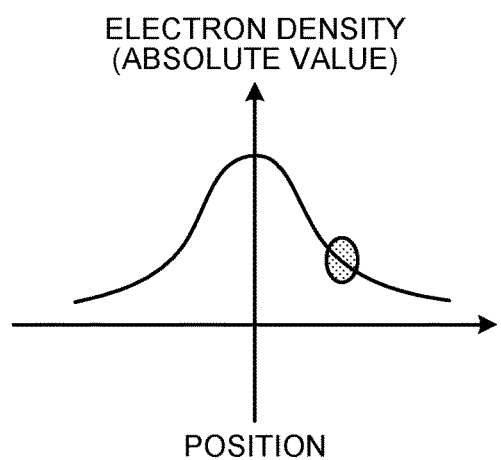
FIG. 2C is a view for explaining the measurement results of the electron density of the plasma measured by the probe measuring instrument and light-emitting monitor.

Hereinafter, a principle of detecting the electron density of the plasma in the plasma generation apparatus 1 according to the embodiment will be described in detail with reference to FIGS. 2A to 2C. FIG. 2A is a view for explaining a measurement result of the electron density of the plasma measured by the probe measuring instrument 205. FIG. 2B is a view for explaining a measurement result of the electron density of the plasma measured by the light-emitting monitor 200. FIG. 2C is a view for explaining the measurement results of the electron density of the plasma measured by the probe measuring instrument 205 and light-emitting monitor 200. In FIGS. 2A to 2C, note that a specific position on a straight line in the plasma generation area A1 is taken along the abscissa, whereas the electron density is taken along the ordinate.

As illustrated in FIG. 2A, when the electron density of the plasma in the plasma generation area A1 is measured by the probe measuring instrument 205, measured is an absolute value of electron density of plasma in a vicinity of a predetermined position where the probe 204 is disposed. Accordingly, by controlling the amount of the RF electric power to be supplied by the control device 203 from the RF power source 102 to the cathode 103 and controlling the amount of the gas to be supplied from the gas introduction hole 105 based on the measurement result of the probe measuring instrument 205, it is possible to accurately control the electron density in the vicinity of the predetermined position, where the probe 204 is disposed, in the plasma generation area A1.

On the other hand, as illustrated in FIG. 2B, when the electron density of the plasma in the plasma generation area A1 is measured by the light-emitting monitor 200, measured is a relative value of electron density of plasma in an area along the optical axis X1 in the plasma generation area A1. Accordingly, by controlling the amount of the RF electric power to be supplied by the control device 203 from the RF power source 102 to the cathode 103 and controlling the amount of the gas to be supplied from the gas introduction hole 105 based on the measurement result of the light-emitting monitor 200, it is possible to promptly measure distribution of the electron density in the vicinity of the predetermined position in the area, in the plasma generation area A1, along the predetermined optical axis X1 entering to the light-emitting monitor 200. As the control device 203 driving the condensing lens 201 through the optical axis driving unit 202 and changing the optical axis X1, it is possible to measure the distribution of the electron density of the plasma in the whole area of the plasma generation area A1.

As illustrated in FIG. 2C, when the electron density of the plasma in the plasma generation area A1 is measured by the probe measuring instrument 205 and light-emitting monitor 200, measured are the absolute value of the electron density of the plasma in the vicinity of the predetermined position where the probe 204 is disposed and the relative value of the electron density of the plasma in the area along the optical axis X1 in the plasma generation area A1. Herein, by arranging the optical axis X1 in the area where the probe 204 is disposed, it is possible to compare the relative value of the electron density of the plasma in the area along the optical axis X1 with the absolute value of the electron density of the plasma in the vicinity of the predetermined position where the probe 204 is disposed. Therefore, it is possible to correct the relative value of the electron density of the plasma measured by the light-emitting monitor 200 to an absolute value based on the absolute value of the electron density of the plasma measured by the probe measuring instrument 205. Therefore, by measuring the electron density of the plasma in the plasma generation area A1 with both the probe measuring instrument 205 and light-emitting monitor 200, it is possible to measure the distribution of the electron density of the plasma in the plasma generation area A1 by the absolute value. Accordingly, as the control device 203 controls the amount of the RF electric power to be supplied from the RF power source 102 to the cathode 103 based on the measurement results of the probe measuring instrument 205 and light-emitting monitor 200, it is possible to accurately control the electron density of the plasma in the whole area of the plasma generation area A1.

In the example described in the embodiment, the plasma is generated by supplying the RF electric power to the cathode 103. However, note that the plasma may be generated by applying a magnetic field to the discharge vessel 100 from the outside of the discharge vessel 100 with using a RF coil.

Hereinafter described are whole operations of the plasma generation apparatus 1 according to the embodiment. First, the evacuation device (not illustrated) discharges the gas inside the discharge vessel 100 through the exhaust hole 106 to the outside of the discharge vessel 100 so as to form the vacuum inside the discharge vessel 100. Next, the process gas such as the xenon, argon, and krypton is introduced from the gas introduction hole 105. Next, the process gas inside the discharge vessel 100 is ionized by the RF electric power supplied from the RF power source 102 to the cathode 103 so as to generate the plasma in the plasma generation area A1.

Next, the control device 203 changes the angle of the condensing lens 201 through the optical axis driving unit 202 so as to change, inside the plasma generation area A1, the optical axis X1 of the light of the plasma entering into the light-emitting monitor 200. With this change, the control device 203 measures the emission spectra of the plasma and measures relative spatial distribution of the electron density of the plasma. Herein, the control device 203 may classify the first emission spectrum based on the neutral particles in the plasma and the second emission spectrum based on the ions in the plasma so as to measure the ratio of the spectral intensity between the first emission spectrum and second emission spectrum. The control device 203 also measures with using the probe measuring instrument 205 the absolute value of the electron density of the plasma in the area, where the end of the probe 204 is disposed, inside the plasma generation area A1.

Next, the control device 203 corrects the relative spatial distribution of the electron density of the plasma measured by the light-emitting monitor 200 based on the measurement result measured by the probe measurement instrument 205. The control device 203 then measures absolute spatial distribution of the electron density of the plasma inside the plasma generation area A1. Next, the control device 203 controls the amount of RF electric power to be supplied from the RF power source 102 to the cathode 103 and the amount of the gas to be supplied from the gas introduction hole 105 based on the measured absolute spatial distribution of the electron density of the plasma. By following the above-mentioned steps, the control device 203 controls the electron density inside the plasma generation area A1 to desired electron density.

As mentioned above, according to the plasma generation apparatus 1 of the present embodiment, the optical axis X1 of the light from the plasma entering into the light-emitting monitor 200 is changed by the optical axis driving unit 202. Therefore, it is possible to measure the distribution of the electron density of the plasma generated inside the discharge vessel 100 throughout the whole area of the plasma generation area A1. Moreover, the relative value of the electron density of the plasma measured by the light-emitting monitor 200 can be corrected by the absolute value of the electron density of the plasma measured by the probe measuring instrument 205. Therefore, it is possible to measure the distribution of the absolute value of the electron density of the plasma generated inside the discharge vessel 100 throughout the whole area of the plasma generation area A1. Accordingly, the control device 203 can control the amount of the RF electric power to be supplied to the cathode 103 and the amount of the gas to be supplied from the gas introduction hole 105 based on the distribution of the measured absolute value of the electron density of the plasma. Therefore, it is possible to achieve the plasma generation apparatus 1 capable of controlling the conditions of the plasma properly and stably.

Hereinafter, a plasma thruster according to the embodiment will be described. The plasma thruster according to the present embodiment is applicable to various plasma thrusters such as an ion thruster or hole thruster which are referred to as electrostatically-charged particle thrusters and electromagnetically-charged particle thrusters.

FIG. 3 is a cross-sectional view of an ion thruster 400 using the plasma thruster according to the embodiment. As illustrated in FIG. 3, this ion thruster 400 includes a discharges vessel 401, base plate 401a, and ion beam extraction electrode 402. The discharge vessel 401 has a substantially cylindrical shape in which one end is open. The base plate 401a is provided to the other end of the discharge vessel 401 and is vertical to a central axis A. The ion beam extraction electrode 402 is a multilayer conductive plate provided so as to cover the open end of the discharge vessel 401. In this ion thruster 400, ions generated inside the discharge vessel 401 are accelerated to be made into ion beams. The ion beams are extracted through the ion beam extraction electrode 402 so as to obtain thrust.

A magnetic circuit 403 is disposed in an internal surface of the discharge vessel 401. The magnetic circuit 403 has a magnet which forms a magnetic field inside the discharge vessel 401. A hollow cathode 404 is disposed in a central part of the base plate 401a. The hollow cathode 404 generates electron beams. A thrust gas supply inlet 405 is also disposed in the base plate 401a. The thrust gas supply inlet 405 supplies thrust gas such as xenon, argon, krypton, and heavy hydrogen into the discharge vessel 401. Furthermore, an anode 406 is disposed inside the discharge vessel 401. The anode 406 has an annular shape stretching in the direction of the axis A along an internal surface of the magnetic circuit 403. This anode 406 holds a potential higher than that of the hollow cathode 404. As a result, the electron beams generated by the hollow cathode 404 are accelerated inside the discharge vessel 401 by the anode 406. The accelerated electron beams come into collision with the thrust gas and the thrust gas is ionized so that plasma is generated inside the discharge vessel 401.

The ion beam extraction electrode 402 includes a metallic plate such as molybdenum. A screen grid 407, acceleration grid 408, and deceleration grid 409 are disposed at an interval with each other in the order mentioned from the inside of the discharge vessel 401 in a direction of the axis A.

To the discharge vessel 401, a probe 411 is disposed so that one end thereof faces the other end of the discharge vessel 401. The probe 411 is connected to a probe measuring instrument 412. The probe measuring instrument 412 measures electron density of plasma induced to the other end of the discharge vessel 401. Examples of the probe 411 to be applied herein include various types of probes such as the plasma absorption probe (PAP), Langmuir probe, and antenna probe. A preferable example of the probe 411 is the high frequency probe from the point of view that the electron density of the plasma can be measured quantitatively and efficiently, even though there is the magnetic field and the electron density of the plasma is high. Furthermore, the probe 411 is set within a range in a periphery of the discharge vessel 401. Such a range is to be a plasma generation area where the electron density of the plasma is relatively small (for example, from $1E18\ m^{-3}$ to $1E19\ m^{-3}$). Due to the disposition within the range, the probe 411 can measure the electron density of the plasma accurately as restraining an effect on the electron density of the plasma generated at a central part of the discharge vessel 401 with electron density higher than that of the above-mentioned range. Therefore, the thrust from the ion thruster 400 can be prevented from decreasing. The probe measuring instrument 412 outputs the measured electron density of the plasma to a control device 413.

Figure 4:
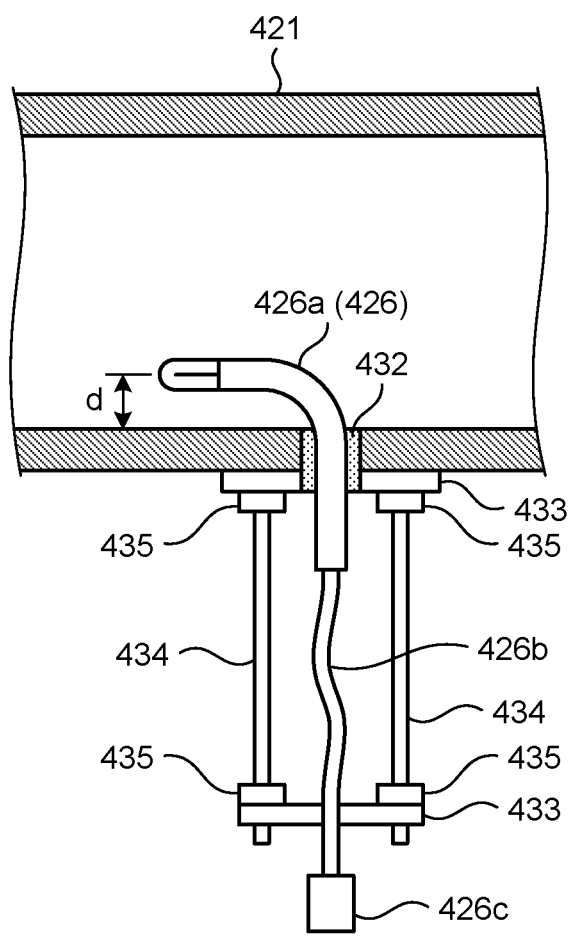
FIG. 4 is a view illustrating an example of a configuration of a plasma measurement unit illustrated in FIG. 3.

FIG. 4 is a view illustrating an example of a configuration of the probe 411 illustrated in FIG. 3. An end 426a of a sensor probe 426 is covered with a quartz pipe having a substantial L-shape in a plane view. The end 426a of the sensor probe 426 is disposed at a predetermined interval d from a wall surface 421 of the plasma measurement unit in a direction of the plasma generation unit. By changing the predetermined interval d, it is possible to measure electron density of plasma in a randomly-selected area in the plasma measurement unit. The end 426a of the sensor probe 426 is coupled to a receptor connector 426c through a connecting code 426b. A gap between the end 426a of the sensor probe 426 and the plasma measurement unit is sealed with an adhesive 432 such as a vacuum Torr Seal. The sensor probe 426 is fixed to the plasma measurement unit by a pair of supporting boards 433, spacers 434, and nuts 435. The spacers 434 are disposed between the pair of supporting boards 433. The nuts 435 fix the spacers 434 to the supporting boards 433.

As illustrated in FIG. 3, a light-emitting monitor 414 is disposed in an outside of the discharge vessel 401. The light-emitting monitor 414 receives light of the plasma generated in the discharge vessel 401 so as to measure emission spectra. A condensing lens 415 is disposed between the light-emitting monitor 414 and discharge vessel 401. The condensing lens 415 condenses the light of the plasma inside the discharge vessel 401 and irradiates the condensed light to the light-emitting monitor 414. This condensing lens 415 is coupled to an optical axis driving unit 416 which changes an angle of the condensing lens 415. By changing the angle of the condensing lens 415, the optical axis driving unit 416 changes, inside the discharge vessel 401, an optical axis X3 of the light of the plasma entering into the light-emitting monitor 414. The light-emitting monitor 414 outputs the measured emission spectra of the plasma on the control device 413.

The control device 413 can be achieved, for example, by using the general-purpose computer such as the central processing unit (CPU), read only memory (ROM), and random access memory (RAM) or the exclusive-use computer and the program running on these computers. The control device 413 controls an amount of electric current and voltage to be supplied from a power source (not illustrated) to the magnetic circuit 403, hollow cathode 404, and anode 406 and an amount of gas to be supplied from a thrust gas supply unit (not illustrated) to the discharge vessel 401 based on the measured electron density of the plasma measured by the probe measurement instrument 412 and based on the emission spectra of the plasma measured by the light-emitting monitor 414. By following the above-mentioned steps, the control device 413 controls the electron density of the plasma generated in the discharge vessel 401 to desired electron density. The control device 413 drives the condensing lens 415 through the optical axis driving unit 416 and controls the optical axis X3 of the light of the plasma entering into the light-emitting monitor 414. As a result, it is possible to measure by the light-emitting monitor 414 the electron density of the plasma in the whole area of the discharge vessel 401.

Preferably, the control device 413 classifies a first emission spectrum based on neutral particles in the plasma and a second emission spectrum based on ions in the plasma both measured by the light-emitting monitor 414. Then, the control device 413 preferably controls the amount of the electric current and voltage to be supplied to the magnetic circuit 403, hollow cathode 404, and anode 406 and the amount of the gas to be supplied to the discharge vessel 401 based on a ratio of spectral intensity between the first emission spectrum and second emission spectrum. Accordingly, conditions of the plasma can be controlled based on the ratio of the spectral intensity between the neutral particles and ions of the plasma. Therefore, it is possible to qualitatively control the electron density of the plasma with ease. Furthermore, the control device 413 controls an amount of flow of the thrust gas introduced to the discharge vessel 401 through the thrust gas supply unit (not illustrated) and a mixing ratio of the thrust gas.

Figure 5:
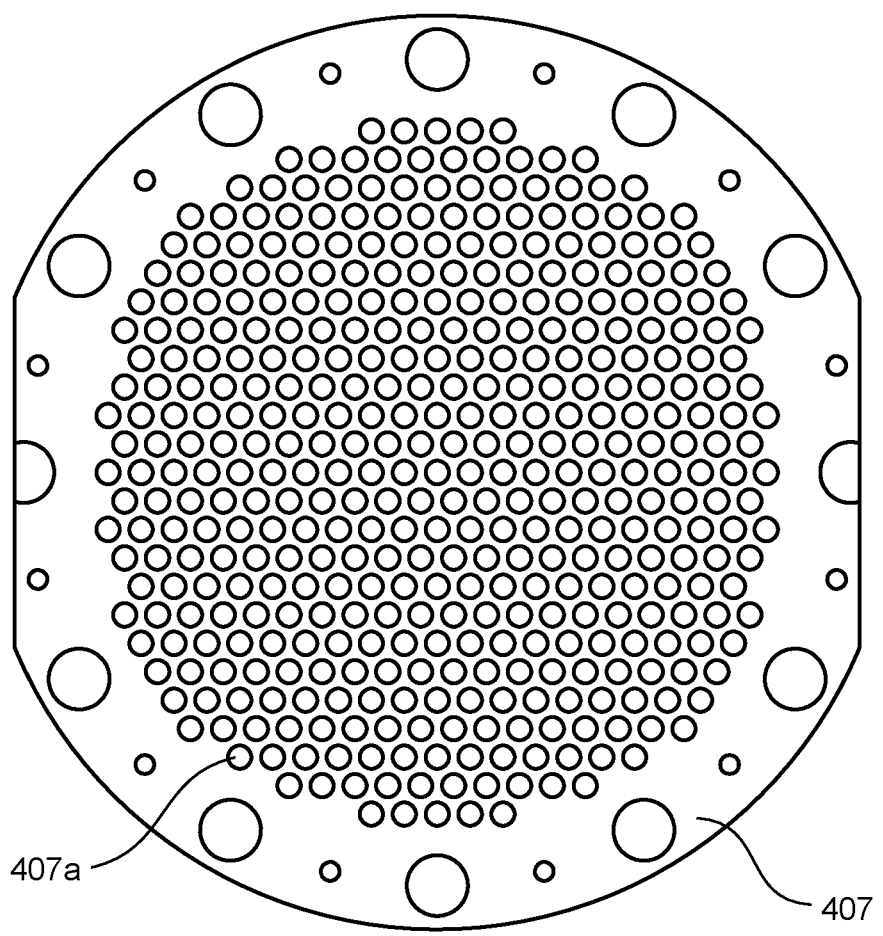
FIG. 5 is a front view of a screen grid.

FIG. 5 is a front view of the screen grid 407. As illustrated in FIG. 5, the screen grid 407 is provided with a plurality of penetrating screen ion-extraction holes 407a. Not only the screen grid 407 but also the acceleration grid 408 (not illustrated in FIG. 5, see FIG. 3) and deceleration grid 409 (not illustrated in FIG. 5, see FIG. 3) are provided with a plurality of accelerated-ion extraction holes and a plurality of decelerated-ion extraction holes respectively. These screen ion-extraction holes 407a, accelerated-ion extraction holes, and decelerated-ion extraction holes share an axis and are disposed along the axis A so as to overlap equally.

The screen grid 407 has a potential equivalent to that of the discharge vessel 401 (for example, +1 kV) and holds the generated plasma inside the discharge vessel 401. The acceleration grid 408 has a potential lower than that of the screen grid 407 (for example, −500 V) and accelerates cations of the plasma inside the discharge vessel 401 toward the acceleration grid 408 along the axis A. The deceleration grid 409 has a potential higher than that of the acceleration grid 408 (for example, 0V). The deceleration grid 409 prevents ions in a downstream of the acceleration grid 408 from being reabsorbed by the acceleration grid 408 and from colliding with the acceleration grid 408 such that the acceleration grid 408 is protected.

Hereinafter describes are whole operations of the ion thruster 400 according to the embodiment. First, the control device 413 supplies the thrust gas from thrust gas supply inlet 405 into the discharge vessel 401 through the thrust gas supply unit (not illustrated) in accordance with the amount of flow of the thrust gas under a design condition set in advance and the mixing ratio of the thrust gas. The control device 413 further supplies predetermined electric power to the magnetic circuit 403, hollow cathode 404, and anode 406 in accordance with the amount of the electric current and voltage under a design condition set in advance. As a result, the electron beams are generated from the hollow cathode 404 and the electron beams are accelerated by the anode 406. As accelerated, the electron beams transfer spirally inside the discharge vessel 401 due to the magnetic field formed by the magnetic circuit 403 having the magnet. Then, the electron beams are confined inside the discharge vessel 401. Due to this spirally transfer, the electron beams come into collision with the thrust gas inside the discharge vessel 401 and are ionized. Accordingly, the thrust gas such as the xenon, argon, krypton, and heavy hydrogen is made into the plasma so that a plasma source 10 is generated inside the discharge vessel 401.

The acceleration grid 408 has the potential lower than the potential of the discharge vessel 401. Therefore, an electric field caused by a potential difference between the acceleration grid 408 and discharge vessel 401 is formed inside the discharge vessel 401. Due to this electric field, the cations of the plasma are accelerated toward the acceleration grid 408. The accelerated cations are discharged to the outside of the discharge vessel 401 in the direction of the axis A as passing through the plurality of equally overlapping screen ion-extraction holes 407a, accelerated-ion extraction holes, and decelerated-ion extraction holes. Accordingly, the ion thruster 400 is imparted with thrust corresponding to momentum of the cations.

Next, the control device 413 changes the angle of the condensing lens 415 through the optical axis driving unit 416 so as to change, inside the discharge vessel 401, the optical axis X3 of the light of the plasma entering into the light-emitting monitor 414. With this change, the control device 413 measures the emission spectra of the plasma and measures relative spatial distribution of the electron density of the plasma. Herein, the control device 413 may classify the first emission spectrum based on the neutral particles in the plasma and the second emission spectrum based on the ions in the plasma so as to measure the ratio of the spectral intensity between the first emission spectrum and second emission spectrum. The control device 413 also measures with using the probe measuring instrument 412 an absolute value of electron density of plasma in an area, where the end of the probe 411 is disposed, inside the discharge vessel 401.

Next, the control device 413 corrects the relative spatial distribution of the electron density of the plasma measured by the light-emitting monitor 414 based on a measurement result measured by the probe measurement device 412. The control device 413 then measures an absolute spatial distribution of the electron density of the plasma inside the discharge vessel 401. Next, the control device 413 controls the amount of the electric current and voltage of the RF electric power to be supplied to the magnetic circuit 403, hollow cathode 404, and anode 406 based on the measured absolute spatial distribution of the electron density of the plasma. The control device 413 further controls the amount of flow of the thrust gas introduced to the discharge vessel 401 and the mixing ratio of the thrust gas. According to the above-mentioned steps, it is possible to control the electron density of the plasma generated in the discharge vessel 401 to the design condition.

As mentioned above, according to the ion thruster 400 of the present embodiment, the optical axis X3 of the light from the plasma entering into the light-emitting monitor 414 is changed by the optical axis driving unit 416. Therefore, it is possible to measure the distribution of the electron density of the plasma generated inside the discharge vessel 401 throughout the whole area of the discharge vessel 401. Moreover, the relative value of the electron density of the plasma measured by the light-emitting monitor 414 can be corrected by the absolute value of the electron density of the plasma measured by the probe measuring instrument 412. Therefore, it is possible to measure the distribution of the absolute value of the electron density of the plasma generated inside the discharge vessel 401 throughout the whole area of the discharge vessel 401. Accordingly, the control device 413 controls the electric power to be supplied to the magnetic circuit 403, hollow cathode 404, and anode 406 and controls the amount of flow of the thrust gas to be supplied to the discharge vessel 401 and the mixing ratio of the thrust gas based on the distribution of the measured absolute value of the electron density of the plasma. The control device 413 further controls properly the condition of the plasma so as to control the thrust. Accordingly, even in a case, for example, where the amount of flow of the thrust gas is short or where each electric current of the magnetic circuit 403, hollow cathode 404, and anode 406 changes so that the ion thruster 400 cannot obtain the thrust in accordance with the design condition, it is possible to measure the electron density of the plasma accurately and to control the plasma to a proper condition. Therefore, it is possible to confirm and control the stable operations of the ion thruster 400 under the design condition.

Described in the above-mentioned embodiment is an example in which the plasma thruster is applied to the ion thruster. However, the present invention is also applicable to other plasma thrusters such as a hole thruster and magneto-plasma-dynamic (MPD)/hollow cathode type plasma thruster.

Figure 6:
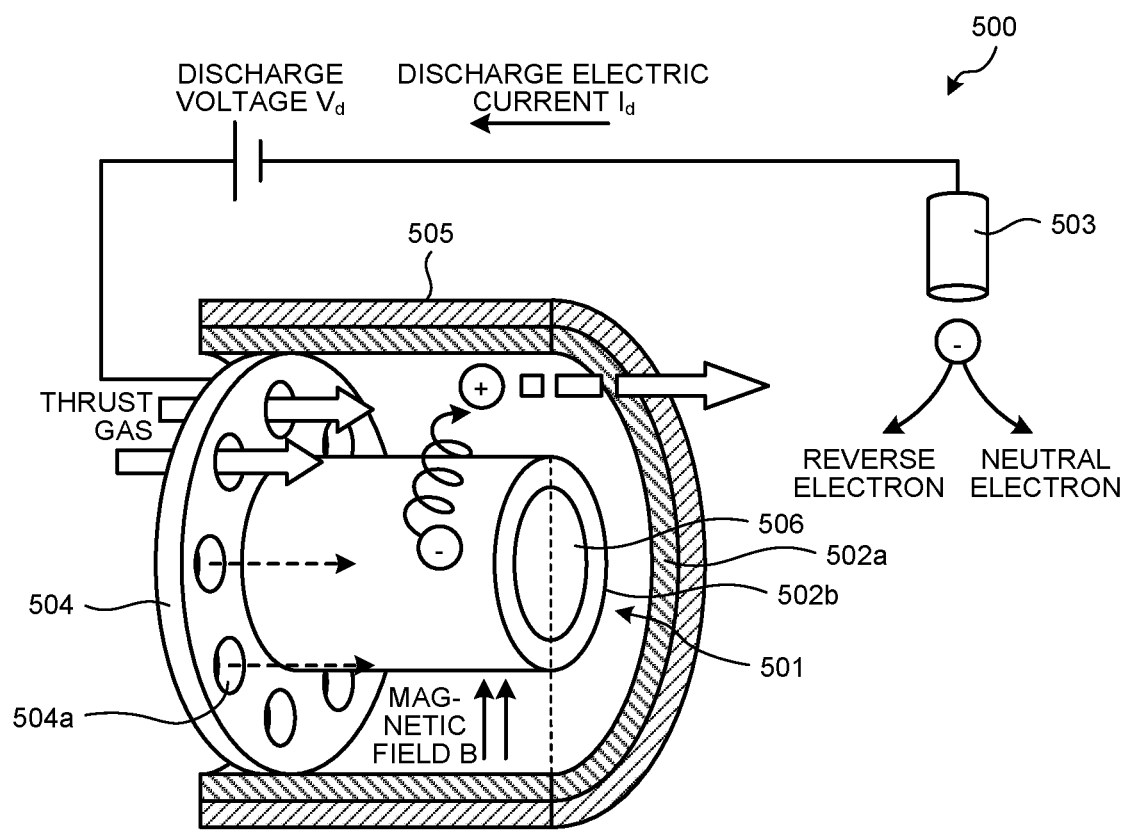
FIG. 6 is a conceptual diagram of a hole thruster.

FIG. 6 is a conceptual diagram of a hole thruster 500. This hole thruster 500 includes an annular acceleration channel 501. This acceleration channel 501 includes a channel external wall 502a and channel internal wall 502b. One end of the acceleration channel 501 is open. The end herein is in a downstream of a gas-flow direction of thrust gas. In a vicinity of the end in the downstream of the acceleration channel 501, a cathode 503 is disposed. In an upstream of the acceleration channel 501, an anode 504 is disposed. The anode 504 is provided with a plurality of thrust gas supply inlets 504a supplying the thrust gas to the acceleration channel 501. Examples of the thrust gas include the xenon, argon, krypton, and heavy hydrogen. To an outside of the channel external wall 502a, a peripheral magnetic core 505 is disposed. To an inside of the channel internal wall 502b, a central magnetic core 506 is disposed.

To the acceleration channel 501, a magnetic field B in a radial direction and an electric field in an axial direction are applied. A magnetic coil is provided to a magnetic circuit formed by the peripheral magnetic core 505 and central magnetic core 506. Due to leakage of magnetic flux to be generated, the magnetic field in the radial direction is applied to the acceleration channel 501. Voltage is applied between the anode 504 and cathode 503 so as to form an electric field in the axial direction. Electrons discharged from the cathode 503 and flowing into the acceleration channel 501 circles inside the acceleration channel 501 in a circumferential direction due to an interaction between the electric field and magnetic field. Then, electric current in the circumferential direction referred to as hole current is formed and the electrons are confined. The thrust gas to be supplied from the thrust gas supply inlets 504a is ionized as colliding with the electrons confined as the hole current and then plasma is generated. Only ions are accelerated and ejected from the plasma by the electric field in the axial direction. Thereafter, thrust of the hole thruster 500 can be obtained due to a reaction of such acceleration and ejection. The ejected ions connect with the electrons discharged from the cathode 503 and become neutral particles.

Figure 7:
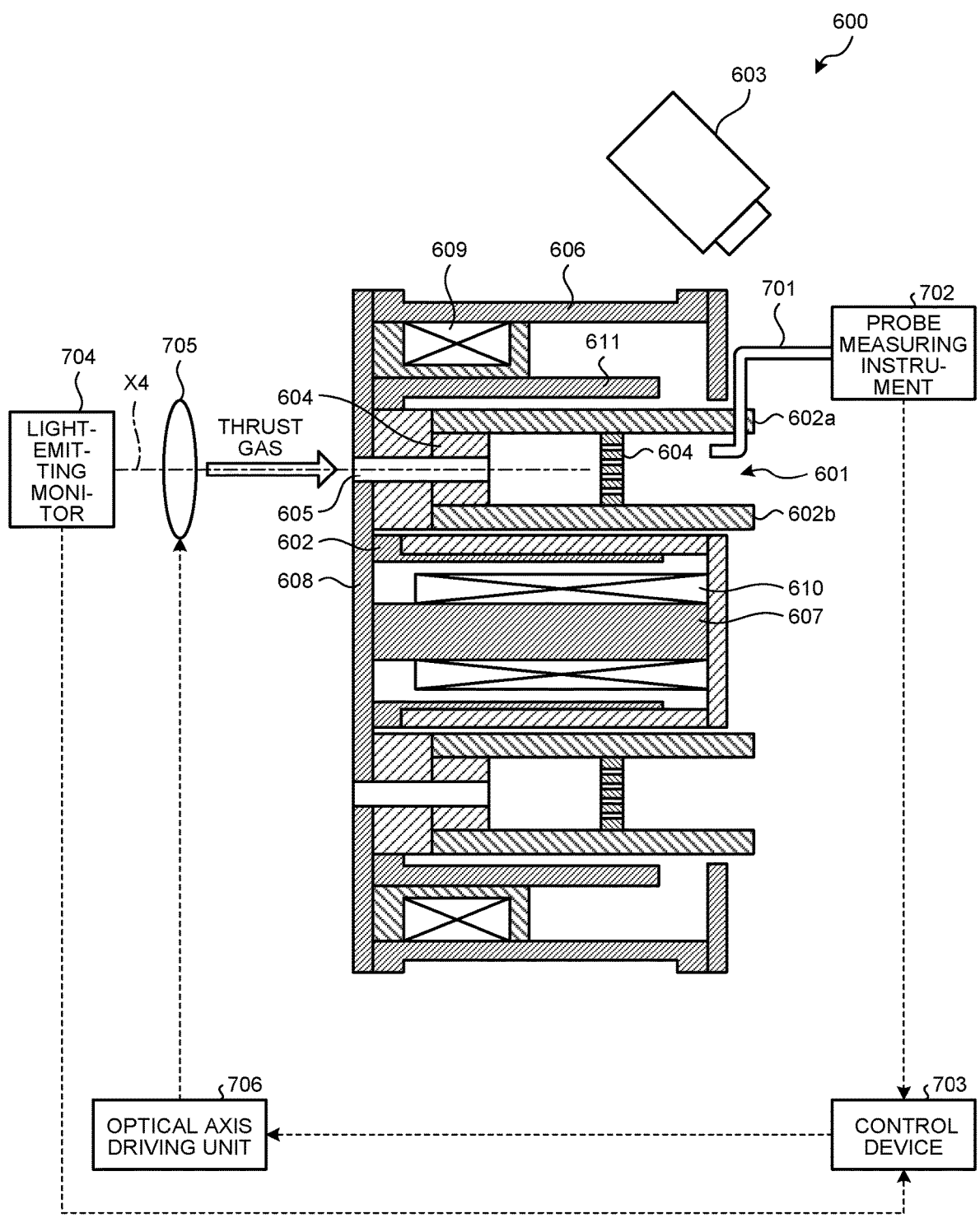
FIG. 7 is a schematic cross-sectional view illustrating the hole thruster using the plasma thruster according to the embodiment.

FIG. 7 is a schematic cross-sectional view illustrating a hole thruster 600 using the plasma thruster according to the embodiment. As illustrated in FIG. 7, in the hole thruster 600 according to the present embodiment, an acceleration channel 601 includes an annular space formed by a channel external wall 602a and channel internal wall 602b. A cathode 603 is disposed in a vicinity of an end of a downstream in a gas flow direction of thrust gas in the acceleration channel 601. In an upstream of the acceleration channel 601, an anode 604 is disposed. To an end of the upstream of the acceleration channel 601, a thrust gas supply inlet 605 is provided.

In an outside of the channel external wall 602a, a peripheral magnetic core 606 is disposed, whereas in an inside of the channel internal wall 602b, a central magnetic core 607 is disposed. A back-end plate 608 disposed in an end side of the upstream of the acceleration channel 601 performs as a yoke forming a magnetic path between the peripheral magnetic core 606 and central magnetic core 607. The peripheral magnetic core 606 and central magnetic core 607 are respectively provided with an external magnetic coil 609 and internal magnetic coil 610. Between the external magnetic coil 609 and acceleration channel 601 and between the internal magnetic coil 610 and acceleration channel 601, magnetic shields 611 and 602 are disposed respectively. The hole thruster 600 is provided with the magnetic shields 611 and 602 so as to break leaking magnetic flux. The leaking magnetic flux is transmitted through only an end of the downstream of the acceleration channel 601 so as to form magnetic distribution concentrating on a predetermined position.

To channel external wall 602a, a probe 701 is disposed so that one end thereof faces the other end of the acceleration channel 601. The probe 701 is connected to a probe measuring instrument 702 measuring electron density of plasma inside the acceleration channel 601. Examples of the probe 701 to be applied herein include various types of probes such as the plasma absorption probe (PAP), Langmuir probe, and antenna probe. A preferable example of the probe 701 is the high frequency probe from the point of view that the electron density of the plasma can be measured quantitatively and efficiently, even though there is a magnetic field and the electron density of the plasma is high. Furthermore, the probe 701 is preferably set within a range in a periphery of the acceleration channel 601. Such a range is to be a plasma generation area where the electron density of the plasma is relatively small (for example, from 1E18 $m^{-3}$ to 1E19 $m^{-3}$). Due to the disposition within this range, the probe 701 can measure the electron density of the plasma accurately as restraining an effect on the electron density of the plasma generated at a central part of the acceleration channel 601 with electron density higher than the above-mentioned range. Therefore, thrust from the hole thruster 600 can be prevented from decreasing. The probe measuring instrument 702 outputs the measured electron density of the plasma to the control device 703.

In a vicinity of the thrust gas supply inlet 605, a light-emitting monitor 704 is disposed. The light-emitting monitor 704 receives light of the plasma generated in the acceleration channel 601 and measures emission spectra. Between the light-emitting monitor 704 and thrust gas supply inlet 605, a condensing lens 705 is disposed. The condensing lens 705 condenses the light of the plasma inside the acceleration channel 601 and irradiates the condensed light to the light-emitting monitor 704. This condensing lens 705 is coupled to an optical axis driving unit 706 which changes an angle of the condensing lens 705. By changing the angle of the condensing lens 705, the optical axis driving unit 706 changes, inside the acceleration channel 601, an optical axis X4 of the light of the plasma entering into the light-emitting monitor 704. The light-emitting monitor 704 outputs the measured emission spectra of the plasma on a control device 703.

The control device 703 can be achieved, for example, by using the general-purpose computer such as the central processing unit (CPU), read only memory (ROM), and random access memory (RAM) or the exclusive-use computer and the program running on these computers. The control device 703 controls an amount of electric current and voltage to be supplied from a power source (not illustrated) to the cathode 603, anode 604, peripheral magnetic core 606, and central magnetic core 607 and an amount of gas to be supplied to the acceleration channel 601 based on the measured electron density of the plasma measured by the probe measurement device 702 and based on the emission spectra of the plasma measured by the light-emitting monitor 704. By following the above-mentioned steps, the control device 703 controls the electron density of the plasma inside a acceleration channel 601 to desired electron density. The control device 703 drives the condensing lens 705 through the optical axis driving unit 706 so as to control the optical axis X4 of the light of the plasma entering into the light-emitting monitor 704. As a result, it is possible to measure the electron density of the plasma in the whole area of the acceleration channel 601 by the light-emitting monitor 704.

Preferably, the control device 703 classifies a first emission spectrum based on neutral particles in the plasma and a second emission spectrum based on ions in the plasma both measured by the light-emitting monitor 704. Then, the control device 703 preferably controls the amount of the electric current and voltage to be supplied to the cathode 603, anode 604, peripheral magnetic core 606, and central magnetic core 607 and the amount of the gas to be supplied to the acceleration channel 601 based on a ratio of spectral intensity between the first emission spectrum and second emission spectrum. Accordingly, conditions of the plasma can be controlled based on the ratio of the spectral intensity between the neutral particles and ions of the plasma. Therefore, it is possible to qualitatively control the electron density of the plasma with ease. Furthermore, the control device 703 controls an amount of flow of the thrust gas to be introduced to the acceleration channel 601 through the thrust gas supply inlet (not illustrated) and a mixing ratio of the thrust gas.

Hereinafter described are whole operations of the hole thruster 600 according to the embodiment. First, the control device 703 supplies the thrust gas from the thrust gas supply inlet 605 to the acceleration channel 601 through a thrust gas supply unit (not illustrated) in accordance with the amount of flow of the thrust gas under a design condition set in advance and the mixing ratio of the thrust gas. The control device 703 further applies electric power under a design condition set in advance to the peripheral magnetic core 606 and central magnetic core 607. As a result, a magnetic field in a radial direction is applied to the acceleration channel 601. Furthermore, the control device 703 applies voltage under a design condition set in advance between the anode 604 and cathode 603 so as to form an electric field in an axial direction in the acceleration channel 601. As a result, electrons discharged from the cathode 603 and flowing into the acceleration channel 601 circles inside the acceleration channel 601 in a circumferential direction due to an interaction of the electric field and magnetic field. Then, electric current in the circumferential direction referred to as hole current is formed and the electrons are confined. The thrust gas to be supplied from the thrust gas supply inlet 605 is ionized as colliding with the electrons confined as the hole electric current and then the plasma is generated. Only the ions are accelerated and ejected from the plasma by the electric field in the axial direction. Thereafter, the thrust of the hole thruster 600 can be obtained due to a reaction of such acceleration and ejection.

Next, the control device 703 changes the angle of the condensing lens 705 through the optical axis driving unit 706 so as to change, inside the acceleration channel 601, the optical axis X4 of the light of the plasma entering into the light-emitting monitor 704. With this change, the control device 703 measures the emission spectra of the plasma and measures relative spatial distribution of the electron density of the plasma. Herein, the control device 703 may classify the first emission spectrum based on the neutral particles in the plasma and the second emission spectrum based on the ions in the plasma so as to measure the ratio of the spectral intensity between the first emission spectrum and second emission spectrum. The control device 703 also measures with using the probe measuring instrument 702 an absolute value of electron density of plasma in an area, where the end of the probe 701 is disposed, inside the acceleration channel 601.

Next, the control device 703 corrects the relative spatial distribution of the electron density of the plasma measured by the light-emitting monitor 704 based on a measurement result measured by the probe measurement device 702. The control device 703 then measures an absolute spatial distribution of the electron density of the plasma inside the acceleration channel 601. Next, the control device 703 controls the voltage applied to the peripheral magnetic core 606, central magnetic core 607, anode 604, and cathode 603 based on the measured absolute spatial distribution of the electron density of the plasma. Furthermore, the control device 703 controls the amount of flow of the thrust gas introduced to the acceleration channel 601 and the mixing ratio of the thrust gas. According to the above-mentioned steps, it is possible to control the electron density of the plasma generated in the acceleration channel 601 to the design condition.

As mentioned above, according to the hole thruster 600 of the present embodiment, the optical axis X4 of the light from the plasma entering into the light-emitting monitor 704 is changed by the optical axis driving unit 706. Therefore, it is possible to measure the distribution of the electron density of the plasma generated inside the acceleration channel 601 throughout the whole area of the acceleration channel 601. Moreover, the relative value of the electron density of the plasma measured by the light-emitting monitor 704 can be corrected by the absolute value of the electron density of the plasma measured by the probe measuring instrument 702. Therefore, it is possible to measure the distribution of the absolute value of the electron density of the plasma generated inside the acceleration channel 601 throughout the whole area of the acceleration channel 601. Accordingly, the control device 703 controls the voltage to be applied to the peripheral magnetic core 606, central magnetic core 607, anode 604, and cathode 603 and controls the amount of flow of the thrust gas to be supplied to acceleration channel 601 and the mixing ratio of the thrust gas based on the distribution of the measured absolute value of the electron density of the plasma. The control device 703 further controls the condition of the plasma so as to properly control the thrust. Accordingly, even in a case, for example, where the amount of flow of the thrust gas is short and each voltage applied to the peripheral magnetic core 606, central magnetic core 607, anode 604, and cathode 603 changes so that the hole thruster 600 cannot obtain the thrust in accordance with the design condition, it is possible to measure the electron density of the plasma accurately and to control the plasma to a proper condition. Therefore, it is possible to confirm and control the stable operations of the hole thruster 600 under the design conditions.

REFERENCE SIGNS LIST

1 PLASMA GENERATION APPARATUS INCLUDING MEASUREMENT DEVICE
100 DISCHARGE VESSEL (PLASMA GENERATION UNIT)
101 ANODE
102 RF POWER SOURCE
103 CATHODE
104 INSULATION MEMBER
105 GAS INTRODUCTION HOLE
106 EXHAUST HOLE
107 LIGHT TRANSMISSION WINDOW
108 OBJECT TO BE PROCESSED
200 LIGHT-EMITTING MONITOR (EMISSION SPECTRA MEASUREMENT DEVICE)
201 CONDENSING LENS
202 OPTICAL AXIS DRIVING UNIT
203 CONTROL DEVICE
204 PROBE
205 PROBE MEASURING INSTRUMENT
400 ION THRUSTER
401 DISCHARGE VESSEL (PLASMA GENERATION UNIT)
401a BASE PLATE
402 ION BEAM EXTRACTION ELECTRODE
403 MAGNETIC CIRCUIT
404 HOLLOW CATHODE
405 THRUST GAS SUPPLY INLET
406 ANODE
407 SCREEN GRID
408 ACCELERATION GRID
409 DECELERATION GRID
411, 426 PROBE
412 PROBE MEASURING INSTRUMENT (PROBE MEASUREMENT DEVICE)
413 CONTROL DEVICE
414 LIGHT-EMITTING MONITOR (EMISSION SPECTRA MEASUREMENT DEVICE)
415 CONDENSING LENS
416 OPTICAL AXIS DRIVING UNIT
421 WALL SURFACE
432 ADHESIVE
433 SUPPORTING BOARD
434 SPACER
435 NUT
500, 600 HOLE THRUSTER
501, 601 ACCELERATION CHANNEL (PLASMA GENERATION UNIT)
502a, 602a CHANNEL EXTERNAL WALL
502b, 602b CHANNEL INTERNAL WALL
503, 603 CATHODE
504, 604 ANODE
504a, 605 THRUST GAS SUPPLY INLET
505, 606 PERIPHERAL MAGNETIC CORE
506, 607 CENTRAL MAGNETIC CORE
608 BACK-END PLATE
609 EXTERNAL MAGNETIC COIL
610 INTERNAL MAGNETIC COIL
611, 612 MAGNETIC SHIELD
701 PROBE
702 PROBE MEASURING INSTRUMENT (PROBE MEASUREMENT DEVICE)
703 CONTROL DEVICE
704 LIGHT-EMITTING MONITOR (EMISSION SPECTRA MEASUREMENT DEVICE)
705 CONDENSING LENS
706 OPTICAL AXIS DRIVING UNIT
A1 PLASMA GENERATION AREA
X1 to X4 OPTICAL AXIS

The invention claimed is:

1. A plasma generation apparatus including a measurement device, comprising;
a plasma generation unit configured to ionize gas introduced to an inside thereof so as to generate plasma;
an emission spectra measurement device configured to measure a relative value of electron density of the plasma by emission spectra of the plasma;
a probe measurement device configured to measure an absolute value of the electron density of the plasma by a probe in the plasma generation unit;
a control device configured to: (i) correct the relative value of the electron density of the plasma measured by the emission spectra measurement device to a corrected absolute value based on the absolute value of the electron density of the plasma measured by the probe measurement device; and (ii) control at least one of an amount of electric power to be supplied to the plasma generation unit, magnetic field distribution, and an amount of supply gas based on measurement results of the corrected absolute value; and an optical axis driving unit configured to change an optical axis of light from the plasma entering the emission spectra measurement device.

2. The plasma generation apparatus according to claim 1, wherein the emission spectra measurement device is configured to classify a first emission spectrum based on a neutral particle in the plasma and a second emission spectrum based on an ion in the plasma and measure a ratio of spectral intensity between the first emission spectrum and second emission spectrum, and the control device is configured to control the at least one of the amount of the electric power to be supplied to the plasma generation unit, the magnetic field distribution, and the amount of the supply gas based on the ratio of spectral intensity between the first emission spectrum and second emission spectrum which has been measured.

3. The plasma generation apparatus according to claim 1, wherein the probe is a high frequency probe which is at least one of a plasma absorption probe (PAP), a Langmuir probe, an antenna probe, and a probe operable at electron densities greater than $1E19$ $m^{-3}$.

4. The plasma generation apparatus according to claim 1, wherein the probe is in an area where the electron density of the plasma is equal to $1E18$ $m^{-3}$ or more and $1E19$ $m^{-3}$ or less.

5. A plasma thruster comprising the plasma generation apparatus according to claim 1.

6. The plasma generation apparatus according to claim 2, wherein the probe is a high frequency probe which is at least one of a plasma absorption probe (PAP), a Langmuir probe, an antenna probe, and a probe operable at electron densities greater than $1E19$ $m^{-3}$.

7. The plasma generation apparatus according to claim 2, wherein the probe is in an area where the electron density of the plasma is equal to $1E18$ $m^{-3}$ or more and $1E19$ $m^{-3}$ or less.

8. The plasma generation apparatus according to claim 3, wherein the probe is in an area where the electron density of the plasma is equal to $1E18$ $m^{-3}$ or more and $1E19$ $m^{-3}$ or less.

9. The plasma generation apparatus according to claim 6, wherein the probe is in an area where the electron density of the plasma is equal to $1E18$ $m^{-3}$ or more and $1E19$ $m^{-3}$ or less.

\* \* \* \* \*